(12) United States Patent
Yamazaki et al.

(10) Patent No.: US 9,918,391 B2
(45) Date of Patent: *Mar. 13, 2018

(54) ELECTRONIC COMPONENT MOUNTING SYSTEM

(71) Applicant: PANASONIC INTELLECTUAL PROPERTY MANAGEMENT CO., LTD., Osaka (JP)

(72) Inventors: Takuya Yamazaki, Yamanashi (JP); Hiroki Sagara, Yamanashi (JP); Hirokazu Takehara, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 251 days.

This patent is subject to a terminal disclaimer.

(21) Appl. No.: 14/439,912

(22) PCT Filed: Nov. 1, 2013

(86) PCT No.: PCT/JP2013/006494
§ 371 (c)(1),
(2) Date: Apr. 30, 2015

(87) PCT Pub. No.: WO2014/068994
PCT Pub. Date: May 8, 2014

(65) Prior Publication Data
US 2015/0296629 A1 Oct. 15, 2015

(30) Foreign Application Priority Data

Nov. 1, 2012 (JP) ................................. 2012-241570

(51) Int. Cl.
*H05K 3/30* (2006.01)
*H05K 13/08* (2006.01)

(52) U.S. Cl.
CPC ............. *H05K 3/303* (2013.01); *H05K 13/08* (2013.01); *H05K 2203/0195* (2013.01); *H05K 2203/16* (2013.01)

(58) Field of Classification Search
CPC ...... B25J 9/1674; B25J 9/1687; B25J 9/1694; H05K 13/08; H05K 3/303; Y10S 901/44; Y10T 29/53174
See application file for complete search history.

(56) References Cited

U.S. PATENT DOCUMENTS 6,161,277 A * 12/2000 Asai ....................... H05K 13/08
198/586
6,176,011 B1 * 1/2001 Shirakawa ......... H05K 13/0408
29/740

(Continued)

FOREIGN PATENT DOCUMENTS

CN 102164474 A 8/2011
JP 08-222887 A 8/1996

(Continued)

OTHER PUBLICATIONS

Chinese Office Action and Search Report issued in application No. 201380057442.3 dated Aug. 2, 2016.

(Continued)

*Primary Examiner* — Minh Trinh
(74) *Attorney, Agent, or Firm* — Pearne & Gordon LLP

(57) ABSTRACT

An electronic component mounting system includes a component information change history storage unit that stores component information including operating parameters for numerical determination of an operation mode of an electronic component mounting operation unit and a change history of the component information, a mounting error recorder that detects a mounting error occurring during an electronic component mounting operation and records mounting error information relating to an occurrence situ- (Continued)

ation of the mounting error, and a display unit that displays a transition of the mounting error. When the component information is changed, the display unit displays the past mounting error information in which the mounting error information relating to the mounting error occurring during the electronic component mounting operation for the electronic component as changed is associated with the past component information immediately before the change is stored in the past mounting error storage unit on a display screen.

3 Claims, 8 Drawing Sheets

(56) References Cited

U.S. PATENT DOCUMENTS

| 2010/0325860 | A1 | 12/2010 | Maenishi | |
| 2015/0289386 | A1* | 10/2015 | Yamazaki | B25J 9/1674 29/739 |
| 2015/0296629 | A1* | 10/2015 | Yamazaki | H05K 13/08 29/739 |

FOREIGN PATENT DOCUMENTS

| JP | 2000-261197 | A | 9/2000 |
| JP | 2003-283188 | A | 10/2003 |
| JP | 3736283 | B2 | 1/2006 |
| JP | 2009-224764 | A | 10/2009 |

OTHER PUBLICATIONS

International Search Report for Application No. PCT/JP2013/006494 dated Jan. 14, 2014.

* cited by examiner

FIG. 5
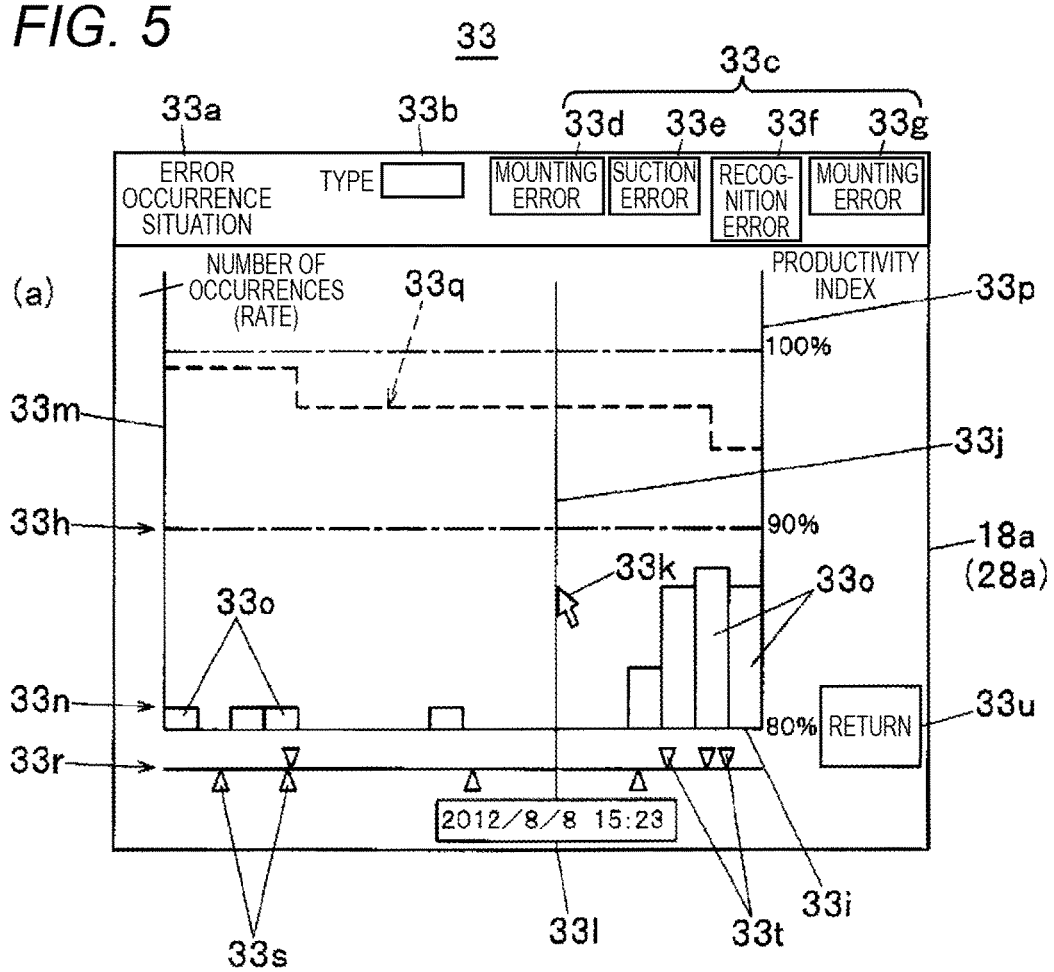
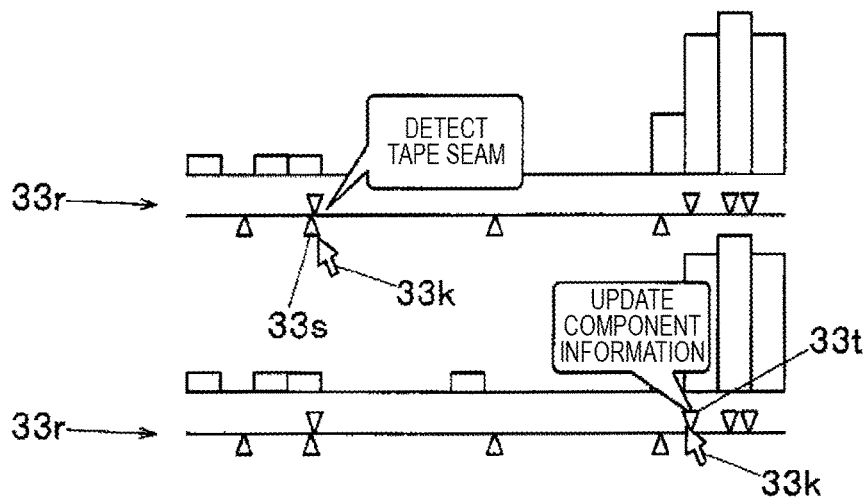

ELECTRONIC COMPONENT MOUNTING SYSTEM

TECHNICAL FIELD

The present invention relates to an electronic component mounting system that executes an electronic component mounting operation for mounting a plurality of types of electronic components on a board.

BACKGROUND ART

Various types of mounting operations constitute an electronic component mounting operation for mounting an electronic component on a board, such as a suction operation for taking out the electronic component from a component supply unit by using a suction nozzle, a recognition operation for imaging and recognizing the electronic component taken out, and a loading operation for transporting and loading the electronic component to and on the board. During the electronic component mounting operation, a fine operation for micro component handling has to be executed with high precision and high efficiency. Accordingly, in an electronic component mounting device for executing the component mounting operation, an operating parameter for executing each operation in an optimal operation mode is set in advance according to the type of the electronic component and is stored in the form of a data table (for example, refer to Patent Literatures 1 and 2).

In the related art according to Patent Literature 1, an optimal speed and an optimal acceleration that are operating parameters for a control axis such as a mounting head that transports and loads the electronic component and an XY table that positions the board are stored as the data table by component type. In the related art according to Patent Literature 1, the type of the suction nozzle used and a mounting speed are switched according to the type of the electronic component that is an object.

CITATION LIST

Patent Literature

Patent Literature 1: JP-A-2000-261197
Patent Literature 2: JP-A-2003-283188

SUMMARY OF INVENTION

Technical Problem

Demands for universality for meeting demands for high-mix and low-volume production have increased for electronic component mounting systems producing mounting boards. Accordingly, component information including operating parameters are set by component type so that an appropriate mounting operation is ensured for each of various types of electronic components in respective devices constituting the electronic component mounting system.

Various items such as individual device characteristics as well as elements derived from component types should be taken into account in appropriately setting the component information, and thus the setting of the appropriate component information may not be carried out as the case may be. In other words, an individual operator is entrusted with an operation for setting the component information in many cases, and decrease in operation precision and efficiency may result rather from inappropriate component information change based on determination by the operator himself or herself. According to the related art including Patent Literature 1 and Patent Literature 2 described above, it is difficult to check a correlation between change in the component information and variations of operation precision and productivity. Thus, reference to the past change history and restoration of the component information to a proper state are impossible in the event of deterioration of operation precision and productivity due to the inappropriate change in the component information.

An objective of the present invention is to provide an electronic component mounting system that is capable of referring to a past change history of component information including an operating parameter and restoring the component information to a proper state.

An electronic component mounting system according to the present invention is an electronic component mounting system for mounting a plurality of types of electronic components on a board by using an electronic component mounting operation unit that executes an electronic component mounting operation for mounting the plurality of types of electronic components on the board, the electronic component mounting system including: a component information storage unit that stores component information including an operating parameter for numerical determination of an operation mode of the electronic component mounting operation unit for the electronic component mounting operation; a mounting error recording tool that detects a mounting error occurring during the electronic component mounting operation and records mounting error information relating to an occurrence situation of the mounting error; a component information change history storage unit that stores a change history of the component information stored in the component information storage unit; an associating tool that associates, when the component information is changed, the mounting error information relating to the mounting error occurring during the electronic component mounting operation for the electronic component of the type relating to the component information as changed, with past component information which is the component information immediately before the change stored in the component information change history storage unit; and a component information display tool that displays the past component information and the past mounting error information which are associated with each other on a screen of a display unit.

Advantageous Effects of Invention

In the electronic component mounting system according to the present invention for mounting the plurality of types of electronic components on the board by using the electronic component mounting operation unit, the component information including the operating parameter for numerical determination of the operation mode of the electronic component mounting operation unit and the change history of the component information are stored, the mounting error occurring during the electronic component mounting operation is detected, the mounting error information relating to the occurrence situation of the mounting error is recorded, the transition of the mounting error is displayed on the screen of the display unit, and when the component information is changed, the past mounting error information in which the mounting error information relating to the mounting error occurring during the electronic component mounting operation for the electronic component of the type relating to the component information as changed is associated with the past component information which is the component information immediately before the change is displayed on a display screen so that a correlation between change in the component information and the mounting error can be checked with ease and the past change history of the component information including the operating parameter can be referred to and such component information can be restored to a proper state.

BRIEF DESCRIPTION OF DRAWINGS

In FIG. 5, (a) and (b) are explanatory diagrams of a component information edit screen (3) of the electronic component mounting system according to the embodiment of the present invention.

DESCRIPTION OF EMBODIMENTS

Figure 1:
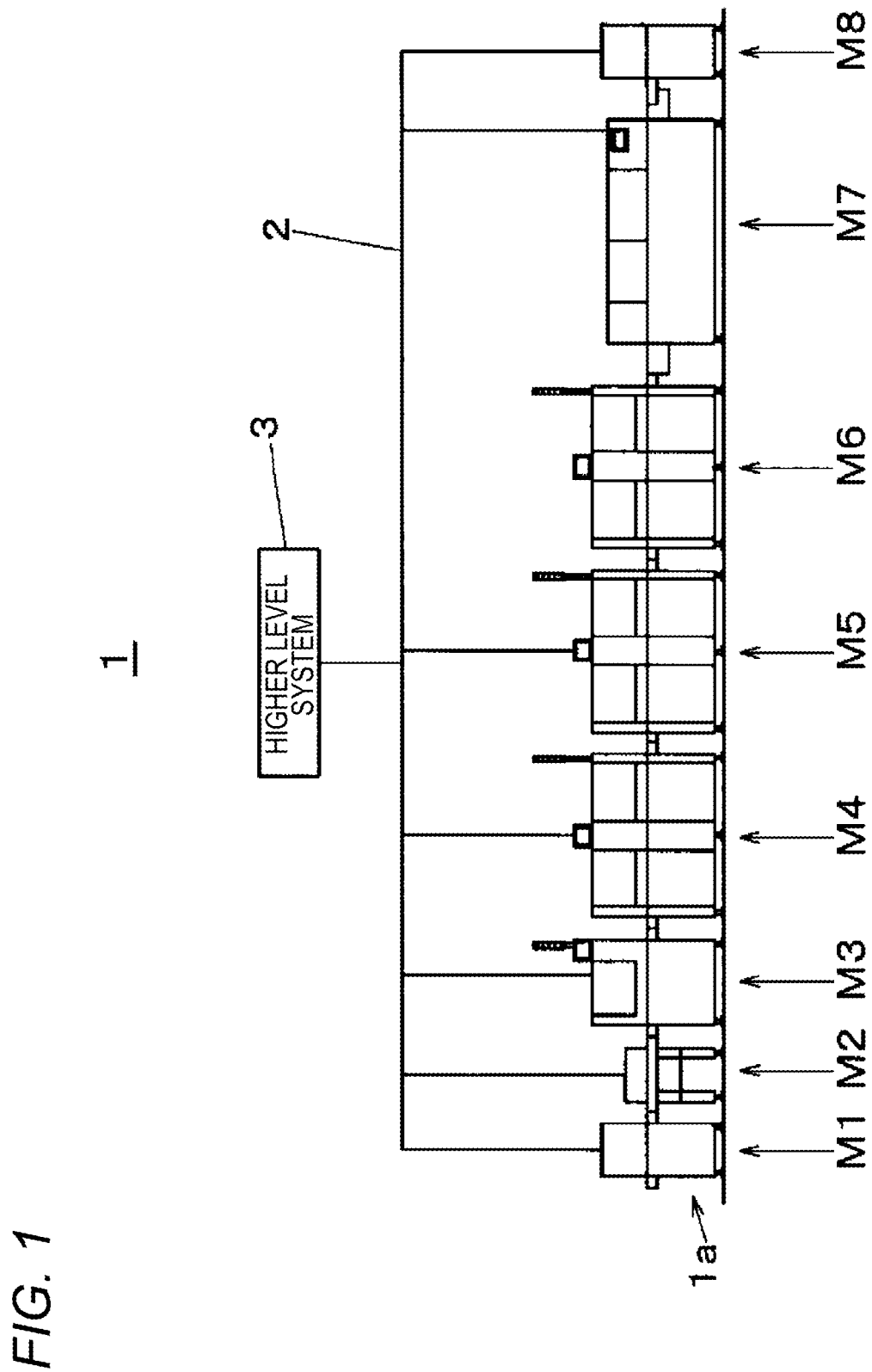
FIG. 1 is an explanatory diagram of a configuration of an electronic component mounting system according to an embodiment of the present invention.

Hereinafter, an embodiment of the present invention will be described with reference to the accompanying drawings. A configuration of an electronic component mounting system 1 will be described first with reference to FIG. 1. The electronic component mounting system 1 functions to mount a plurality of types of electronic components on a board and produce a mounting board by using an electronic component mounting operation unit that executes an electronic component mounting operation for mounting the plurality of types of electronic components on the board. In a component mounting line 1a that is a subject of the electronic component mounting system 1, a printing device M3, a first component mounting device M4 (mounter #1), a second component mounting device M5 (mounter #2), a third component mounting device M6 (mounter #3), and a reflow device M7, which are a plurality of devices for mounting the electronic components, are configured to be connected in series between a board supply device M1 that functions to supply the board and a board delivery device M2 that functions to deliver the board which is the mounting object and a board reception device M8 that functions to receive the board.

Each of the devices from the board supply device M1 to the board reception device M8 is connected to a higher level system 3 that has a management computer via a communication network 2. Board transport mechanisms of the respective devices in the component mounting line 1a are connected in series and form a board transport path. During the component mounting operation, an operation for component mounting for electronic component mounting is performed on the board that is transported along the board transport path by the printing device M3, the first component mounting device M4, the second component mounting device M5, the third component mounting device M6, and the reflow device M7.

In other words, a board 6 that is supplied by the board supply device M1 is carried to the printing device M3 via the board delivery device M2 and then a solder printing operation for screen printing of solder for component bonding is performed on the board 6. After the screen printing, the board 6 is sequentially passed to the first component mounting device M4, the second component mounting device M5, and the third component mounting device M6 so that the component loading operation for electronic component loading is executed on the board after the solder printing. Then, the component-loaded board 6 is carried to the reflow device M7 and is heated according to a predetermined heating profile so that the solder for component bonding is melted and solidified. In this manner, the electronic component is solder-bonded to the board, the mounting board that is the board on which the electronic component is mounted is completed, and the board is received by the board reception device M8.

Figure 2:
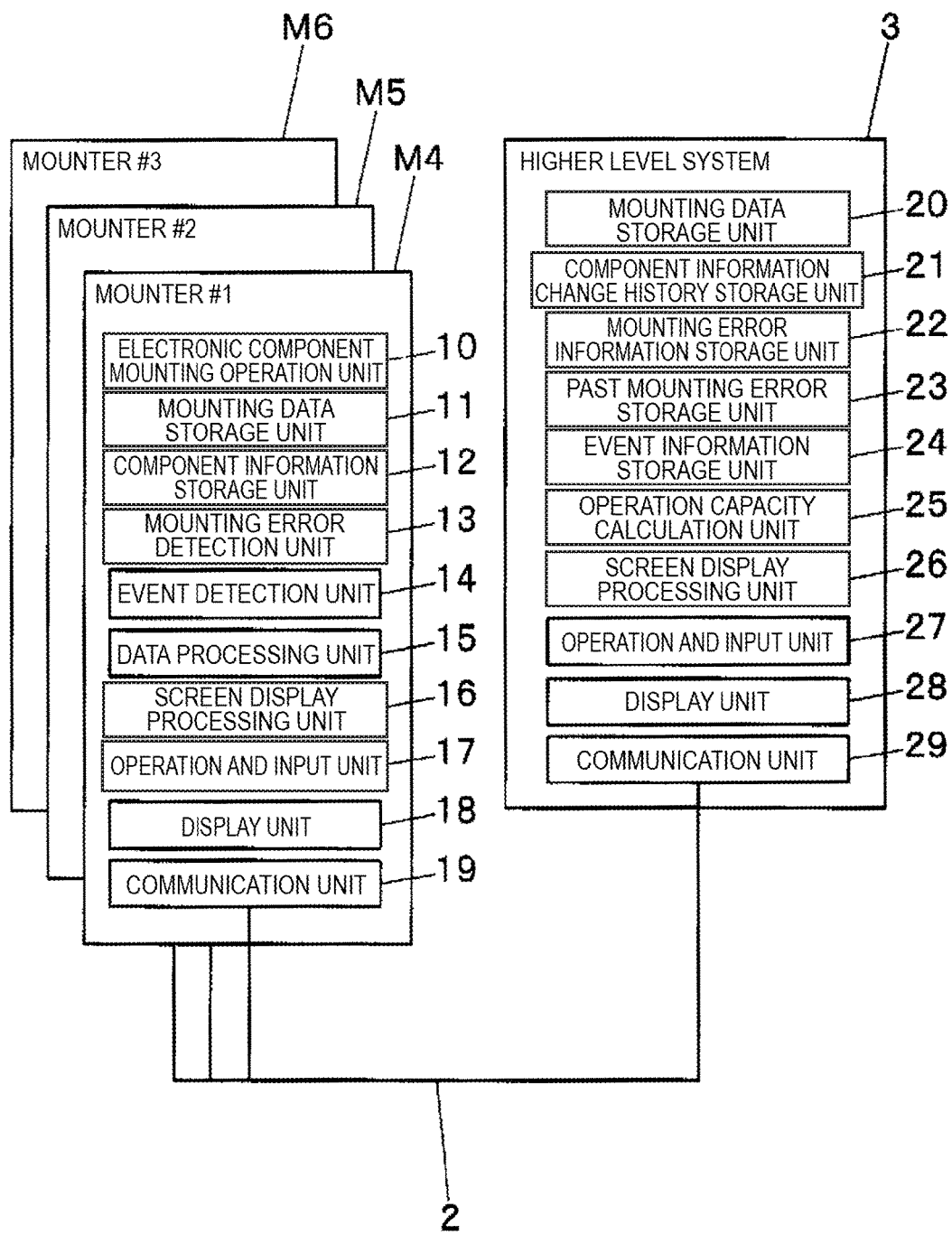
FIG. 2 is a block diagram illustrating configurations of a component mounting device and a higher level system used in the electronic component mounting system according to the embodiment of the present invention.
Figure 3:
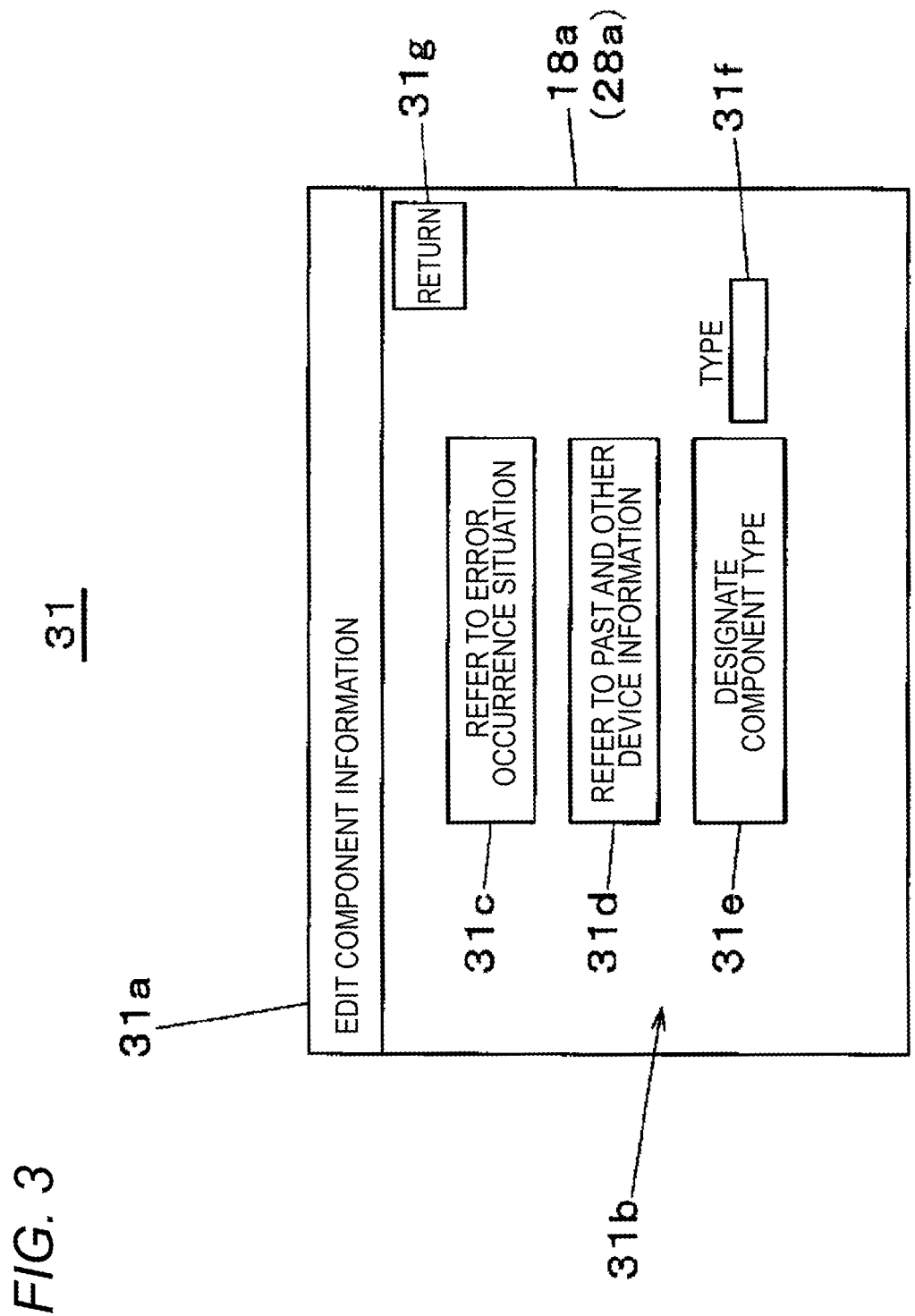
FIG. 3 is an explanatory diagram of a component information edit screen (1) of the electronic component mounting system according to the embodiment of the present invention.

Next, configurations of the first component mounting device M4 to the third component mounting device M6 and the higher level system 3 will be described with reference to FIG. 2. The first component mounting device M4 (mounter #1), the second component mounting device M5 (mounter #2), and the third component mounting device M6 (mounter #3) have the same configuration and only the first component mounting device M4 (mounter #1) is illustrated herein. The first component mounting device M4 (mounter #1) is provided with an electronic component mounting operation unit 10, a mounting data storage unit 11, a component information storage unit 12, a mounting error detection unit 13, an event detection unit 14, a data processing unit 15, a screen display processing unit 16, an operation and input unit 17, a display unit 18, and a communication unit 19.

The electronic component mounting operation unit 10 controls a mounting mechanism section by using a built-in mounting control unit so as to execute the electronic component mounting operation by the component mounting devices, that is, the operation for suctioning the electronic component from a component supply unit by using a loading head, taking out the electronic component, recognizing the electronic component taken out by using a component recognition camera, and then transporting and loading the electronic component to and on the board by using the loading head. The mounting data storage unit 11 stores data required for the control by the mounting control unit, that is, a component mounting position on the board that is a production object, mounting sequence data, and the like.

The component information storage unit 12 stores various types of information regarding the component that is the mounting object. The component information includes an operating parameter for numerical determination of an operation mode of the electronic component mounting operation unit for the electronic component mounting operation. The component information is updated from time to time as necessary and the component information of the latest update date and time is stored therein. The mounting error detection unit 13 performs processing for detecting a mounting error that occurs during the electronic component mounting operation.

The mounting error is an event in which signals from various sensors and a control device timer arranged in respective mechanism sections deviate from a predefined condition in a sequence for executing the mounting operation. The mounting error detection unit 13 detects the occurrence of the mounting error by monitoring the signals. Herein, a suction error that occurs when the component is suctioned and taken out from a tape feeder of the component supply unit, a recognition error that occurs when the component taken out is recognized in a state of being held by the loading head, and a loading error that occurs when the recognized component is transported and loaded to and on the board by the loading head are collectively referred to as the mounting error.

The event detection unit 14 (an event detection tool) detects occurrence of an event that occurs in the electronic component mounting operation unit 10, that is, an event to be recorded on an operation execution history recorded for understanding of a device operation state. The event as a detection object includes any information-associated event in which the component information such as the operating parameter is changed and a hardware-associated event resulting from any variation in a hardware element such as attachment and detachment of the tape feeder in the component supply unit and tape seam detection in the tape feeder. The data processing unit 15 performs processing such as update processing for the component information stored in the component information storage unit 12 and data synchronization between the data processing unit 15 and the higher level system 3. The screen display processing unit 16 performs data processing for displaying various screens for component information editing illustrated in FIGS. 3 to 8.

The operation and input unit 17 is an input device such as a keyboard, a touch panel, and a mouse and is used during operation command and data input. The display unit 18 is a display device such as a liquid crystal panel and performs display of a guide screen for an operation using the operation and input unit 17 and the various screens for component information editing illustrated in FIGS. 3 to 8. The communication unit 19 is a communication interface and performs signal exchange between the other devices and the higher level system 3 via the communication network 2.

The higher level system 3 is provided with a mounting data storage unit 20, a component information change history storage unit 21, a mounting error information storage unit 22, a past mounting error information storage unit 23, an event information storage unit 24, an operation capacity calculation unit 25, a screen display processing unit 26, an operation and input unit 27, a display unit 28, and a communication unit 29.

The mounting data storage unit 20 stores data required for executing the electronic component mounting operation, that is, a mounting position on the board that is the production object, mounting sequence data, and the like, for each component type. The component information change history storage unit 21 stores a change history of the component information stored in the component information storage unit 12, that is, change history data in which content of change in the component information changed from time to time is combined with the update date and time when update is performed. The mounting error information storage unit 22 stores mounting error information relating to an occurrence situation of the mounting error detected by the mounting error detection unit 13 during the electronic component mounting operation. The mounting error detection unit 13 and the mounting error information storage unit 22 are a mounting error recording tool for recording the mounting error information relating to the occurrence situation of the mounting error.

The past mounting error information storage unit 23 stores past mounting error information corresponding to past component information. The event information storage unit 24 links the event detected by the event detection unit 14 to occurrence date and time of the occurrence of the event and records the event. The operation capacity calculation unit 25 performs calculation for calculating an operation capacity of the device in the form of, for example, a productivity index based on actual time required for executing a unit operation. The screen display processing unit 26 performs data processing for displaying various screens.

The operation and input unit 27 is an input device such as a keyboard, a touch panel, and a mouse and is used during operation command and data input. The display unit 28 is a display device such as a liquid crystal panel and performs display of a guide screen for an operation using the operation and input unit 27 and various notification screens. The communication unit 29 is a communication interface and performs signal exchange between the other devices and the higher level system 3 via the communication network 2.

Hereinafter, the various screens that are displayed on a display screen 18a of the display unit 18 during the execution of various operations such as component information editing and reference will be described. Firstly, a component information edit screen (1) 31 that is a main screen which is displayed during initiation of a component information editing operation will be described with reference to FIG. 3. An "edit component information" 31a that shows a title of the component information edit screen (1) 31 is displayed on the display screen 18a. Three selection operation buttons, that is, a "refer to error occurrence situation" 31c, a "refer to past and other device information" 31d, and a "designate component type" 31e are disposed in an operation content selection screen 31b.

Figure 4:
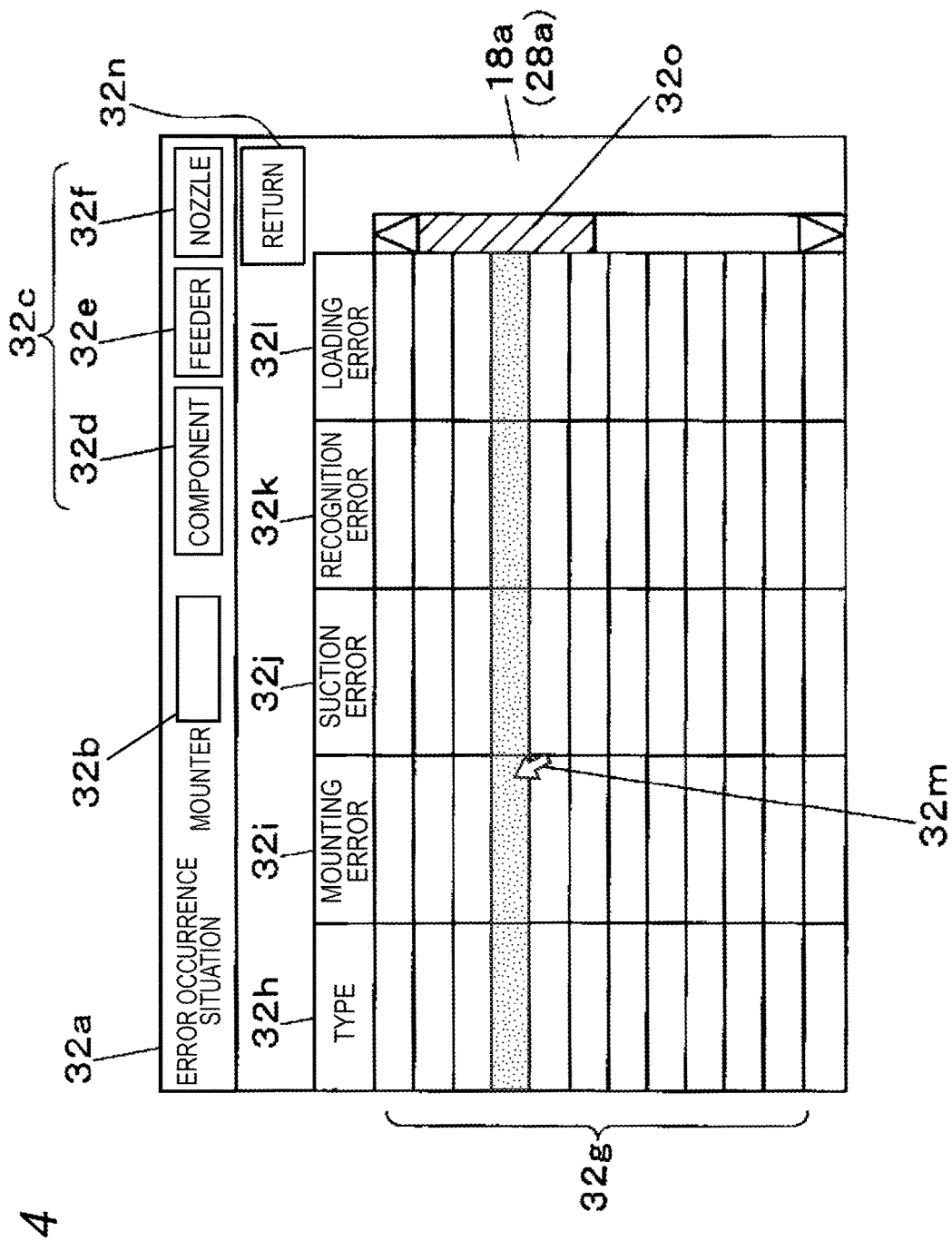
FIG. 4 is an explanatory diagram of a component information edit screen (2) of the electronic component mounting system according to the embodiment of the present invention.
Figure 6:
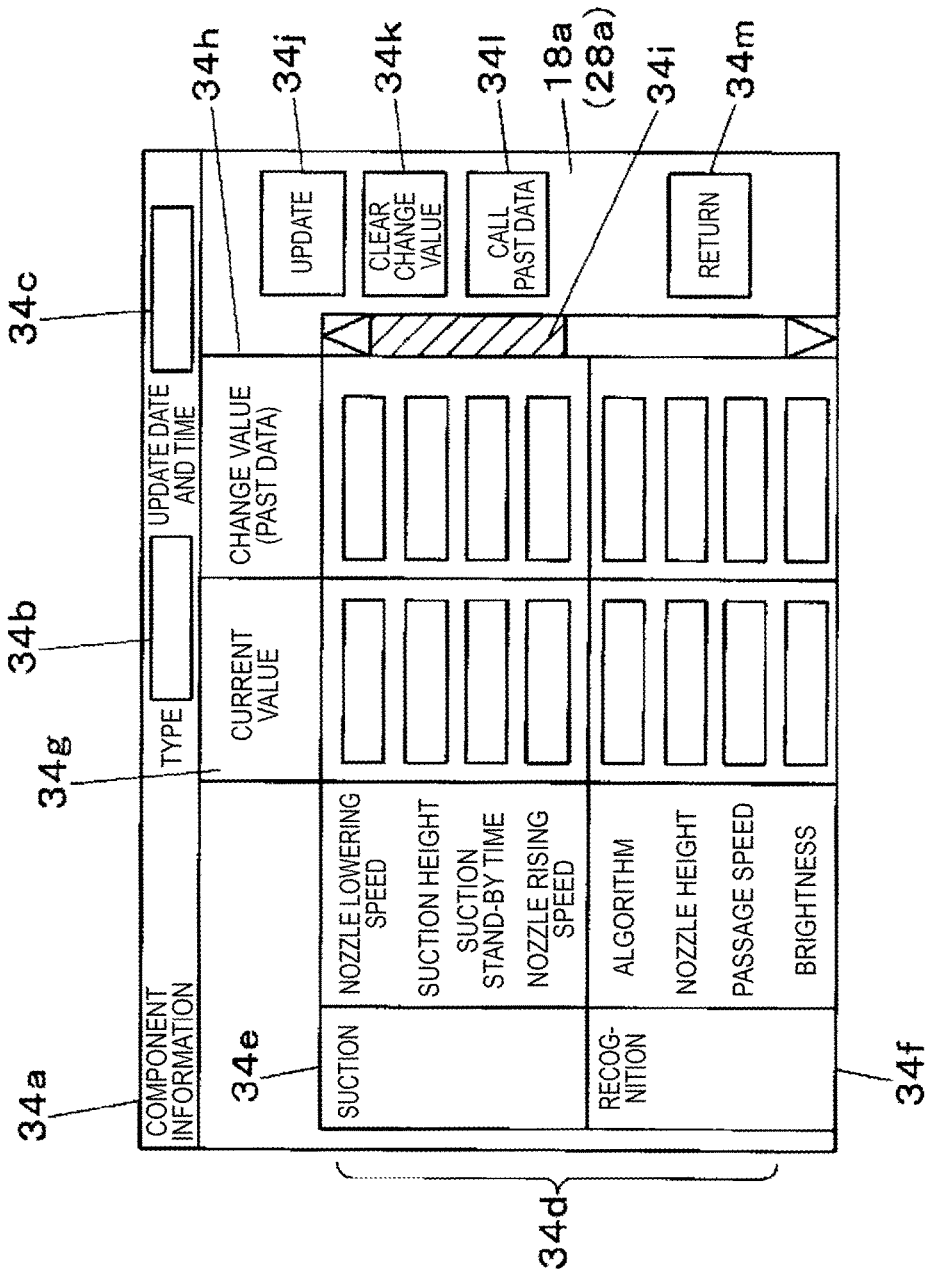
FIG. 6 is an explanatory diagram of a component information edit screen (4) of the electronic component mounting system according to the embodiment of the present invention.
Figure 7:
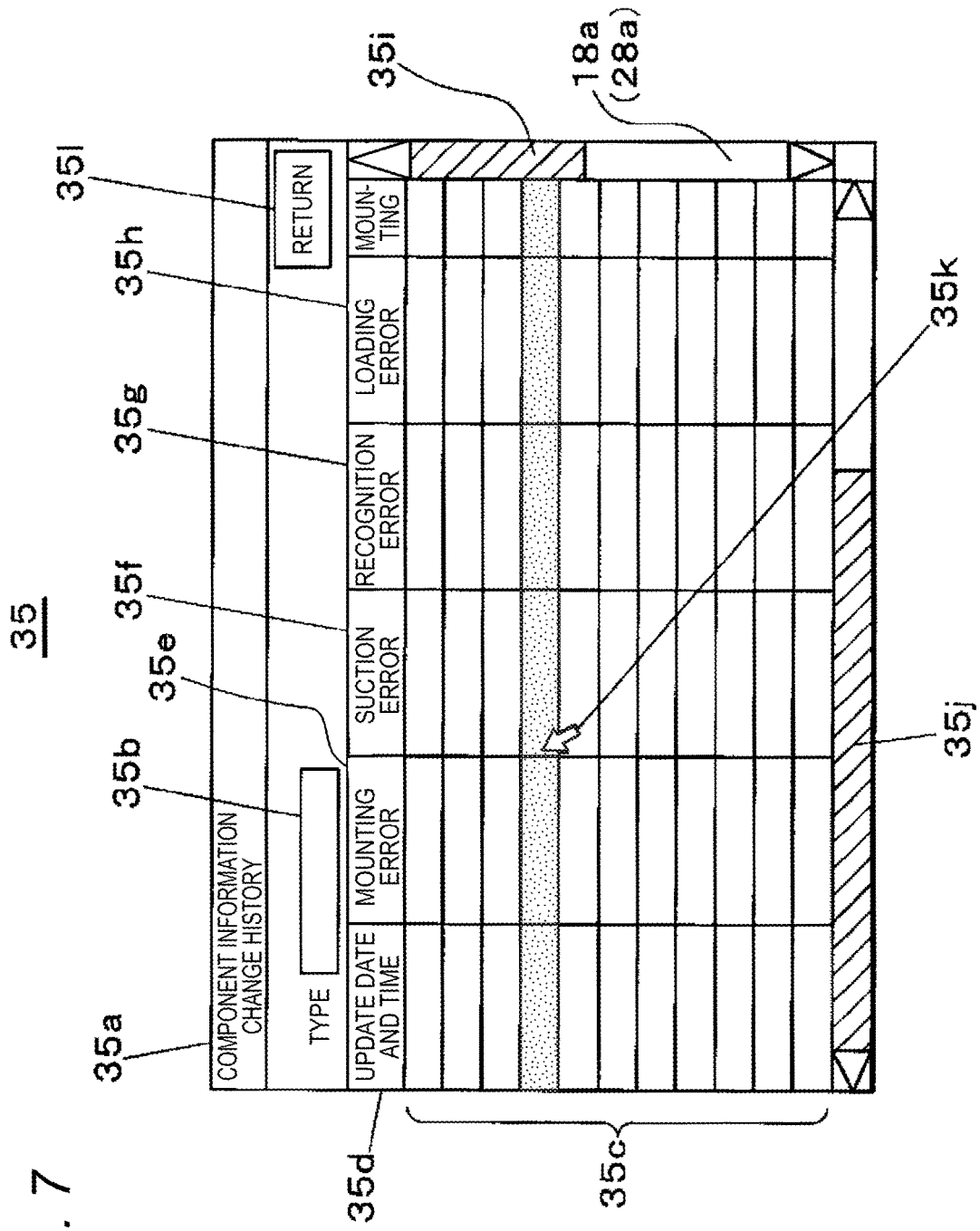
FIG. 7 is an explanatory diagram of a component information edit screen (5) of the electronic component mounting system according to the embodiment of the present invention.

When the "refer to error occurrence situation" 31c is operated, the display screen 18a is shifted to a component information edit screen (2) 32 that is illustrated in FIG. 4 and the mounting error occurrence situation can be referred to. When the "refer to past and other device information" 31d is operated, the display screen is shifted to a component information edit screen (5) 35 that is illustrated in FIG. 7 and past information such as the component information change history, information relating to the other devices, and the like can be referred to. When the "designate component type" 31e is operated by inputting a component type into a "type input field" 31f, the display screen is shifted to a component information edit screen (4) 34 that is illustrated in FIG. 6. When an operation button "return" 31g is operated, the display screen is shifted to a previous screen.

Next, the component information edit screen (2) 32 that is displayed during the reference to the occurrence situation of the mounting error will be described with reference to FIG. 4. As described above, the mounting error collectively refers to the suction error, the recognition error, and the loading error. An "error occurrence situation" 32a that shows a title of the component information edit screen (2) 32 is displayed on the display screen 18a. When a mounter number (any one of #1 to #3 herein) that is a reference object is input into a mounter input field 32b, the reference object is specified. A "component" 32d, a "feeder" 32e, and a "nozzle" 32f are set in a display switch button 32c that is displayed in an upper portion of the screen. When any one of the "component"

32*d*, the "feeder" 32*e*, and the "nozzle" 32*f* is operated, a mounting error display method can be switched by component (electronic component), by feeder (tape feeder), and by nozzle (suction nozzle) and can be displayed in an error display field 32*g* (described later).

In other words, occurrence frequencies of an "suction error" 32*j*, a "recognition error" 32*k*, a "loading error" 32*l*, and a "mounting error" 32*i* that includes the "suction error" 32*j*, the "recognition error" 32*k*, and the "loading error" 32*l* are displayed in the form of a matrix for each "type" 32*h* in the error display field 32*g* . In the illustrated example, the "component" 32*d* is selected in the display switch button 32*c*, the type of the component that is an operation object is displayed in each row of the "type" 32*h*, and the occurrence frequencies of the occurring errors are displayed in respective cells of the error display field 32*g* to correspond to the types.

When the error display field 32*g* is scrolled upward and downward by operating a scroll button 32*o*, an error occurrence situation display can be selected for a desired type. When an operation button "return" 32*n* is operated, the display screen is shifted to a previous screen. When a selection operation such as a double click is performed for a pointer 32*m* to point to a specific row in the error display field 32*g*, the display screen 18*a* is shifted to a component information edit screen (3) 33 that is illustrated in FIG. 5 and the occurrence situation of the mounting error for the component having the type specified by the selection operation can be referred to.

Next, the component information edit screen (3) 33 will be described with reference to FIGS. 5(*a*) and 5(*b*). An "error occurrence situation" 33*a* that shows a title of the component information edit screen (3) 33, a type display field 33*b* that shows the type selected and specified in the component information edit screen (2) 32, and a display switch button 33*c* are displayed on the display screen 18*a*. The display switch button 33*c* functions to switch the type of the error that is a display object in an error occurrence situation display field 33*h* and can refer to the occurrence situation by error type according to classification of an "suction error" 33*e*, a "recognition error" 33*f*, a "loading error" 33*g*, and a "mounting error" 33*d* that includes the "suction error" 33*e*, the "recognition error" 33*f*, and the "loading error" 33*g*.

Details of the error occurrence situation of the type specified in the display switch button 33*c* is displayed, in a graphical form, in the error occurrence situation display field 33*h* with the horizontal axis corresponding to a time axis 33*i* and the vertical axis corresponding to two types of indices, one being an occurrence frequency index axis 33*m* that shows an error occurrence frequency and the other being a productivity index axis 33*p* that shows an actual operation capacity such as measured actual operation time. Herein, a productivity index value is defined as a ratio (%) between operation time in a case where the component information is a standard value and operation time in a state where the component information is a current value.

In an error occurrence frequency display unit 33*n*, the number of occurrences of the error occurring at each timing is displayed as a bar graph 33*o* based on scales of the occurrence frequency index axis 33*m* on and along the time axis 33*i*. The number of occurrences per unit mounting number is used as the error occurrence frequency. However, a rate of occurrence, the cumulative number of occurrences, or the like may be used insofar as the error occurrence frequency is an index that can be produced based on content stored in the mounting error information storage unit 22.

In addition, the productivity index value for each timing is displayed as a line graph 33*q* in the error occurrence situation display field 33*h*. In the example illustrated herein, the productivity index value is within a standard range when the productivity index value is at least 90%, and a productivity variation in the device corresponding to each timing of the time axis 33*i* can be monitored when a transition of the line graph 33*q* is observed. In addition, a date and time designation cursor 33*j* corresponding to specific date and time of the time axis 33*i* is displayed in the error occurrence situation display field 33*h* along with a date and time display field 33*l* that displays the date and time.

When a pointer 33*k* is operated on the screen, the date and time designation cursor 33*j* can be horizontally moved and the date and time corresponding to the date and time designation cursor 33*j* is displayed in the date and time display field 33*l*. When a selection operation such as a double click is performed by using the pointer 33*k* in a state where the date and time designation cursor 33*j* points to a specific timing in the error occurrence situation display field 33*h*, the display screen 18*a* is shifted to the component information edit screen (4) 34 that is illustrated in FIG. 6 and detailed content of the component information such as the operating parameter for the date and time specified by the selection operation can be referred to.

These screen displays are performed by the screen display processing unit 16 as a component information display tool. Firstly, the screen display processing unit 16 functions as the component information display tool for displaying the transition of the mounting error recorded by the mounting error recording tool described above on the display screen 18*a* of the display unit 18 and reading the past component information for designated time and date from the component information change history storage unit 21 based on the designated time and date for display on the screen of the display unit 18. In addition, the screen display processing unit 16 displays the transition of the mounting error on the display screen 18*a* of the display unit 18, in a graphical form using the bar graph 33*o* and the line graph 33*q* in the error occurrence situation display field 33*h* and reads the past component information for date and time designated by the date and time designation cursor 33*j* on the screen displayed in the graphical form from the component information change history storage unit 21 based on the date and time designated by the date and time designation cursor 33*j* for display on the display screen 18*a* of the display unit 18.

In addition, an event display unit 33*r* is displayed along the time axis 33*i* on the component information edit screen (3) 33. In the event display unit 33*r*, an event detected in a time slot corresponding to the time axis 33*i* is displayed to correspond to detection timing. The information-associated event in which the component information such as the operating parameter is changed is displayed in an upper stage and the hardware- associated event resulting from any variation in the hardware element is displayed in a lower stage with signs (herein, information event sign 33*t*∇ and hardware-associated event sign 33*s*Δ, respectively) corresponding to the respective detection timing.

When the pointer 33*k* is allowed to approach any one of the information event sign 33*t*∇ and the hardware-associated event sign 33*s*Δ displayed in the event display unit 33*r* as illustrated in FIG. 5(*b*), the content of the event corresponding to the sign is balloon-displayed. For example, the "tape seam detection" corresponding to the hardware-associated event sign 33*s*Δ is balloon-displayed in the example that is illustrated on the upper side in FIG. 5(*b*) and the "component information update" corresponding to the information event sign 33tV is balloon-displayed in the example that is illustrated on the lower side in FIG. 5(B). When an operation button "return" 33u is operated, the display is shifted to a previous screen.

In other words, the electronic component mounting system 1 is configured to be provided with the event detection unit 14 as the event detection tool for detecting the event occurring in the electronic component mounting operation unit 10 and the event information storage unit 24 that records the detected event and the detection date and time of the detection of the detected event. The screen display processing unit 16 as the component information display tool displays the event stored in the event information storage unit 24 on the display screen 18a along with the transition of the mounting error displayed in a graphical form. On the display screen 18a that shows the occurrence situation of the mounting error in a graphical form, the event that occurs at that time is displayed along therewith in this manner, and thus a correlation between the occurring mounting error and the event can be estimated and determination for selecting the component information appropriate for reducing the mounting error is facilitated.

Next, the component information edit screen (4) 34 that is displayed by a click operation using the pointer 33k described above will be described with reference to FIG. 6. A "component information" 34a that shows a title of the component information edit screen (4) 34, a type display field 34b that displays the type selected in the component information edit screen (3) 33 and becoming an object in the component information edit screen (4) 34, and an update date and time display field 34c that shows update date and time of the component information at a current point in time (component information displayed as the current value) are displayed on the display screen 18a.

In a component information display field 34d, a "current value" display field 34g and a "change value" (past data) display field 34h for the operating parameter as the component information applied to operations corresponding to error classification are displayed for each of the operations corresponding to the error classification (herein, a suction operation 34e corresponding to the suction error, a recognition operation 34f corresponding to the recognition operation, . . . ). For example, a nozzle lowering speed, a suction height, suction stand-by time, and a nozzle rising speed are displayed as the operating parameters for the suction operation 34e and an algorithm, a nozzle height, a passage speed, brightness, and the like are displayed as the operating parameters for the recognition operation 34f. When a scroll button 34i is operated, the component information display field 34d can be scrolled upward and downward and the operating parameter for the loading operation other than the recognition operation 34f or the like can be displayed.

Current component information, that is, component information of the latest update date and time, is displayed in the "current value" display field 34g. In the "change value" display field 34h, the component information of the latest update date and time prior to the date and time designated by the selection operation in the component information edit screen (3) 33 or the component information of the update date and time designated by the selection operation in the component information edit screen (5) 35 is displayed. Since the past data is displayed in the "change value" display field 34h as described above, an operator can call the optimal component information while referring to the occurrence situation of the past mounting error of the device operation.

A numerical value of the "change value" display field 34h can be newly input via the operation and input unit 17 or changed as necessary. When an operation button "change value clear" 34k is operated, the "change value" display field 34h can be cleared. In the case of shift to the component information edit screen (4) 34 by the "designate component type" 31e in the component information edit screen (1) 31, the "change value" display field 34h is a blank.

When an operation button "update" 34j is operated, the component information displayed in the "change value" display field 34h is stored in the component information storage unit 12 of the mounter as the object along with the update date and time because of a component information update processing function of the data processing unit 15. In other words, the data processing unit 15 functions as a component information update tool for storing the past component information displayed on the display screen 18a of the display unit 18 in the component information storage unit 12.

The data processing unit 15 of the mounter stores the detected mounting error in the past mounting error information storage unit 23 along with recording date and time. The recording date and time is update date and time of the component information prior to update. When an operation button "past data call" 34l is operated, the display screen 18a is shifted to the component information edit screen (5) 35 that is illustrated in FIG. 7. When an operation button "return" 34m is operated, the display screen is shifted to a previous screen.

Figure 8:
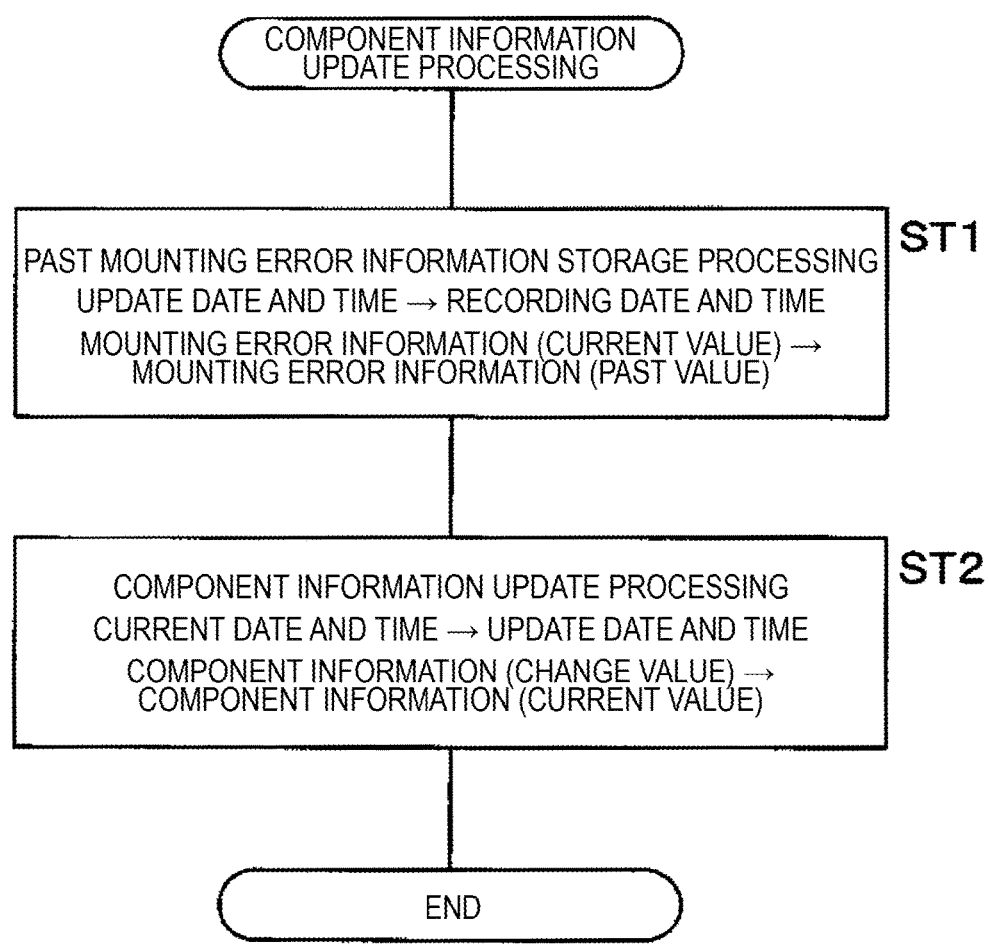
FIG. 8 is a flowchart of component information update processing in the electronic component mounting system according to the embodiment of the present invention.

FIG. 8 illustrates the component information update processing that is executed by the data processing unit 15 of each mounter after the operation button "update" 34j is operated in the component information edit screen (4) 34. Firstly, past mounting error information storage processing is executed (ST1). In other words, processing for storing recording relating to the mounting error occurring when the operation is performed by using the component information immediately before replacement by the "update" in the past mounting error information storage unit 23 is performed with the update date and time of the component information associated with the mounting error information recorded at the point in time of the "update." Specifically, when the operation button "update" is operated, the data processing unit 15 associates the update date and time displayed in the update date and time display field 34c in the component information edit screen (4) 34 with the mounting error information at the current point in time for storage in the past mounting error information storage unit 23.

Next, the component information update processing is executed (ST2). In other words, the update date and time of the update date and time display field 34c of the component information edit screen (4) 34 is replaced with the current date and time and the current value of the component information displayed in the "current value" display field 34g is replaced with the change value of the component information displayed in the "change value" display field 34h. In this manner, the component information change processing is completed.

In the component information change processing described above, the component information prior to the update and the mounting error information showing the mounting error occurring when the operation is performed based on the component information are associated with each other by date and time information (update date and time and recording date and time) for storage in the past mounting error information storage unit 23. In other words, the past mounting error information storage unit 23 is an associating tool for associating the mounting error information relating to the mounting error occurring during the electronic component mounting operation for the electronic component of the type relating to the component information with the past component information which is the component information immediately before the change stored in the component information change history storage unit 21 when the component information is changed. In other words, the associating tool associates the past mounting error information with the past component information by storing the past mounting error information corresponding to the past component information.

Next, the component information edit screen (5) 35 will be described with reference to FIG. 7. A "component information change history" 35*a* that shows a title of the component information edit screen (5) 35, a type display field 35*b* that displays the type selected in the component information edit screen (3) 33 and becoming the object in the component information edit screen (4) 34, and a past mounting error display field 35*c* that shows the past component information and the mounting error information to be comparable to each other are displayed on a display screen 28*a*. In the past mounting error display field 35*c*, a plurality of pieces of information corresponding to the mounting error stored in the past mounting error information storage unit 23 are displayed to correspond to an "update date and time" display field 35*d* for each "update date and time" of the component information and the "recording date and time" corresponding thereto. In other words, occurrence frequencies of an "suction error" 35*f*, a "recognition error" 35*g*, a "loading error" 35*h*, and a "mounting error" 35*e* that includes the "suction error" 35*f*, the "recognition error" 35*g*, and the "loading error" 35*h* are displayed for each "update date and time" display field 35*d* in the past mounting error display field 35*c*. When scroll buttons 35*i* and 35*j* are operated, the past mounting error display field 35*c* can be scrolled upward, downward, rightward, and leftward and the mounting error information for desired update date and time and error type can be displayed.

When a selection operation such as a double click is performed for a pointer 35*k* to point to any update date and time field in the "update date and time" display field 35*d*, the display screen 18*a* is shifted to the component information edit screen (4) 34 that is illustrated in FIG. 6. Then, the component information that shows the content changed at the update date and time designated by the selection operation is displayed in the "change value" display field 34*h* of the component information edit screen (4) 34. Then, the display screen is shifted to a previous screen when an operation button "return" 35*l* is operated.

In other words, the past component information and the past mounting error information associated with each other are displayed on the display screen 18*a* of the display unit 18 by the screen display processing unit 16 as the component information display tool in the component information edit screen (5) 35. The component information display tool displays a plurality of pieces of the past mounting error information in the past mounting error display field 35*c* set on the display screen 18*a* of the display unit 18 and displays the past component information associated with the past mounting error information selected by the operation of the pointer 35*k* on the past mounting error display field 35*c* on the display screen 18*a* of the display unit 18 in the form of the component information edit screen (4) 34.

In the electronic component mounting system 1 for mounting the plurality of types of electronic components on the board by using the electronic component mounting operation unit 10 according to this embodiment described above, the component information including the operating parameter for numerical determination of the operation mode of the electronic component mounting operation unit 10 and the change history of the component information are stored, the mounting error occurring during the electronic component mounting operation is detected, the mounting error information relating to the occurrence situation of the mounting error is recorded, and the transition of the mounting error is displayed on the display screen 18*a* of the display unit 18 while the past component information for the designated date and time is read based on the designated date and time for display on the display screen 18*a*. In addition, the past mounting error information in which the mounting error information relating to the mounting error occurring during the electronic component mounting operation for the electronic component of the type relating to the component information and the past component information which is the component information immediately before the change are associated with each other is displayed on the display screen 18*a* when the component information is further changed. In this manner, the correlation between the change in the component information and the mounting error can be checked with ease and the reference to the component information including the operating parameter and restoration to a proper state can be performed.

In the embodiment described above, a processing execution example in which the screen display processing unit 16 that is provided with the mounters #1 to #3 as the component information display tool is used, the operation via the operation and input unit 17 is performed so that the component information update processing is performed, and the processing result is displayed on the display unit 18 has been described. However, the processing may be executed by the function of the higher level system 3. In this case, the screen display processing unit 26, the operation and input unit 27, and the display unit 28 execute similar processing.

The present application is based on Japanese Patent Application No. 2012-241570 filed on Nov. 1, 2012, the contents of which are incorporated herein by reference.

INDUSTRIAL APPLICABILITY

The electronic component mounting system according to the present invention is capable of performing the reference to the component information including the operating parameter and the restoration to the proper state and can be effectively used in the field of electronic component mounting in which the mounting board is manufactured by mounting the electronic component on the board.

REFERENCE SIGNS LIST

1: Electronic component mounting system
1*a*: Component mounting line
2: Communication network
31: Component information edit screen (1)
32: Component information edit screen (2)
33: Component information edit screen (3)
34: Component information edit screen (4)
35: Component information edit screen (5)
M1: Board supply device
M2: Board delivery device
M3: Printing device
M4: Mounter #1
M5: Mounter #2
M6: Mounter #3
M7: Reflow device
M8: Board reception device

The invention claimed is:

1. An electronic component mounting system for mounting a plurality of types of electronic components on a board by using an electronic component mounter that executes an electronic component mounting operation for mounting the plurality of types of electronic components on the board, the electronic component mounting system comprising:
   a component information storage that stores component information including an operating parameter for numerical determination of an operation mode of the electronic component mounter for the electronic component mounting operation;
   a mounting error recorder that detects a mounting error occurring during the electronic component mounting operation and records mounting error information relating to an occurrence situation of the mounting error;
   a component information change history storage that stores a change history of the component information stored in the component information storage;
   a past mounting error storage that associates, when the component information is changed, the mounting error information relating to the mounting error occurring during the electronic component mounting operation for the electronic component of the type relating to the component information as changed, with past component information which is the component information immediately before the change stored in the component information change history storage; and
   a display that displays a plurality of pieces of the past mounting error information on the screen of the display, and displays the past component information which is associated with the past component error information selected on the screen of the display.

2. The electronic component mounting system according to claim 1, wherein the past mounting error storage stores the past mounting error information corresponding to the past component information.

3. The electronic component mounting system according to claim 1, further comprising a component information updater that stores the past component information displayed on the screen of the display into the component information storage.

* * * * *